United States Patent [19]

Foley et al.

[11] Patent Number: 4,871,015

[45] Date of Patent: Oct. 3, 1989

[54] COOLING ARRANGEMENT

[75] Inventors: John P. Foley, Greenwich; Gary P. Millas, Windsor; Daniel L. Elliott, Southington, all of Conn.

[73] Assignee: United Technologies, Hartford, Conn.

[21] Appl. No.: 218,745

[22] Filed: Jul. 13, 1988

[51] Int. Cl.[4] ......................... F28F 5/00; F28F 13/00
[52] U.S. Cl. ....................................... 165/76; 165/86; 165/96; 165/80.3; 174/16.3; 357/82; 361/384
[58] Field of Search ................ 165/76, 80.3, 86, 96; 174/16.3; 357/82; 361/384, 386

[56] References Cited

U.S. PATENT DOCUMENTS

| | | | |
|---|---|---|---|
| 3,820,592 | 6/1974 | Lander | 165/47 |
| 4,246,597 | 1/1981 | Cole et al. | 357/81 |
| 4,527,620 | 7/1985 | Pedersen | 165/80.3 |
| 4,733,720 | 3/1988 | Havranek et al. | 165/80.4 |
| 4,740,866 | 4/1988 | Kajiwara et al. | 361/382 |

FOREIGN PATENT DOCUMENTS 114364  5/1917  United Kingdom ................. 165/76

Primary Examiner—Martin P. Schwadron
Assistant Examiner—Allen J. Flanigan

[57] ABSTRACT

A heat conducting thermal plate (55) is fixed to a thermal load (10) by means of fasteners (75). Bosses (60) on the thermal plate are received within bosses (75) on an adjacent heat exchanger (25) to maintain a sealed interengagement between those components as the thermal plate is drawn up into surface-to-surface contact with the load.

7 Claims, 2 Drawing Sheets

COOLING ARRANGEMENT

This invention was made with Government support under a contact awarded by the Department of the Navy. The Government has certain rights in this invention.

DESCRIPTION

1. Technical Field

This invention relates to an arrangement for mounting a thermal load to a heat exchanger for cooling the load.

2. Background Art

It is a common practice to provide electronic circuitry for control systems, radar systems and the like for aircraft, ships and other vehicles in modular form, the modules being mounted in chassis therefor from which the modules are readily removable for service or replacement thereof. In those cases where the modules generate significant amounts of heat in the operation thereof, it has been the practice to provide the chassis with heat exchangers which use fluid such as water or air for convectively cooling the electronic circuit module. In certain installations, a relatively massive thermal plate (cold plate) is provided in the chassis between the electronic module and heat exchanger. The thermal plate conducts heat out of the module and into the heat exchanger where it is removed by the fluid flow therethrough.

It will be appreciated that the effectiveness of the thermal plate in conducting heat from the module to the heat exchanger depends in larger measure on the integrity of the surface-to-surface contact between the thermal plate and the electronic module. In other words, optimal extensive mechanical contact between those two members maximizes the amount of heat conducted by away from the module the thermal plate, while gaps or clearances between those members seriously detract from the conductive removal of heat from the module by the thermal plate.

In a typical installation, the electronic module is disposed between a pair of thermal plates, each conducting heat from the module to an associated heat exchanger which may be formed integrally with the chassis. Normally, optimal contact between the module and one of the thermal plates is easily achieved merely by mechanically fastening the module to the plate. However, due to gaps resulting from normal manufacturing tolerances and clearances within the assembly which are necessary for the removal and installation of the module, effective contact between the module and the second thermal plate is oftentimes more difficult to achieve. Those skilled in the art will appreciate that any gaps or clearances between the module and the second thermal plate will adversely effect the ability of the plate to conduct heat from the module to the associated heat exchanger, thereby reducing the reliability of the module and possibly causing the failure thereof due to a build up of heat therein.

DISCLOSURE OF THE INVENTION

In accordance with the present invention, a heat conducting thermal plate (cold plate) is assembled between a thermal load such as an electronic circuit module and an associated heat exchanger in a manner which allows the thermal plate to move with respect to the heat exchanger as the plate is drawn up into operative contact with the module. The thermal plate and heat exchanger are provided with interengageable locators which register with one another over a range of relative spacings between the thermal plate and the heat exchanger to accommodate such movement. Resilient seals disposed between the locators on these two components seal the locators to one another and prevent heat exchange fluid from leaking past the locators which, in the preferred embodiment, also accommodate screws or equivalent fasteners by which the thermal plate is attached to the load. Thus, any gaps or clearances between the thermal plate and the load resulting from normal manufacturing tolerances or required for installation or removal of the module are taken up by drawing the thermal plate toward the load, motion between the thermal plate and its associated heat exchanger being accommodated by movement between the interengaged locators on those members.

In the preferred embodiment, the thermal plate comprises an inside wall of the heat exchanger and includes integral fins thereon for the effective transfer of heat from the plate to a flow of heat exchange fluid within the heat exchanger. The thermal plate and load are supported within a frame (chassis) of which the heat exchanger comprises an integral part of the outer wall thereof. The frame also supports a retaining member on an opposite side of the thermal plate as the heat exchanger. The retaining member carries a resilient means such as a closed cell foam gasket which seals the thermal load from contact with heat exchange fluid and biases the thermal plate toward the heat exchanger for ease in the retraction of the plate from the load.

BEST MODE FOR CARRYING OUT THE INVENTION INDUSTRIAL APPLICABILITY THEREOF

Figure 1:
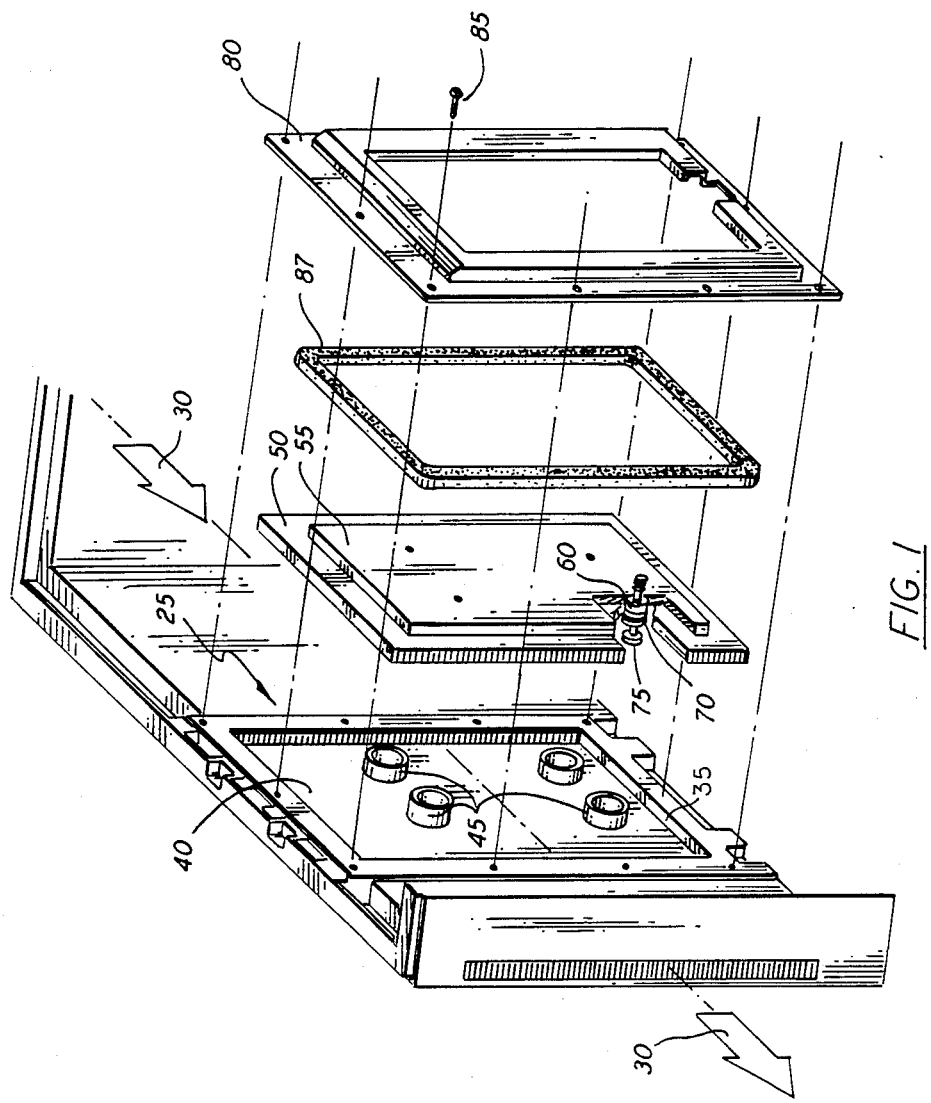
FIG. 1 is an exploded, perspective view of the cooling arrangement of the present invention.

Referring to the drawings, a thermal load such as an electronic circuit module 10 is mounted on and supported by a chassis or frame 15 as by screws or similar fasteners 20. As best seen in FIG. 1, an end wall 25 of chassis 15 comprises a heat exchanger of double-walled, finned construction, the heat exchanger accommodating threrethrough a flow of heat exchange fluid such as air or water as indicated by arrows 30. Heat exchanger 25 is provided with an opening 35 sealed by outer wall 40 which is bored at a plurality of locations thereon, each bore being surrounded by an inwardly extending, generally cylindrical boss (locator) 45. Outer wall 40 thus seals the end of the chassis from leakage of heat exchange fluid thereout.

Heat exchanger 25 is also provided with finned plate 50, the fins thereof being in registry with those formed in the end wall of the chassis to provide continuous fluid passages from one edge of heat exchanger 25 to the other. The fins may be formed from any suitable material, preferrably a metal, which exhibits thermal characteristics desirable for the rejection of heat from the fins into the stream of fluid flowing through the heat exchanger.

Figure 2:
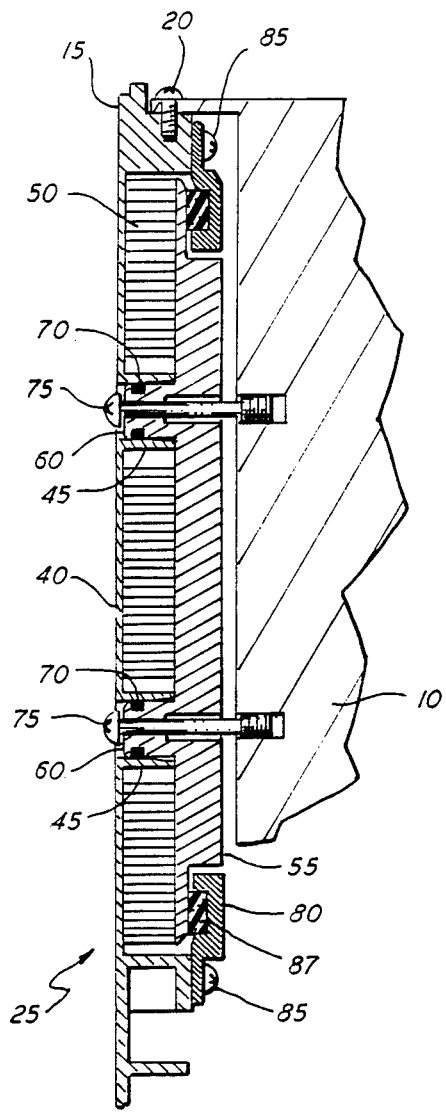
FIG. 2 is a sectioned elevation of the present invention with the thermal plate thereof partially retracted from the thermal load.
Figure 3:
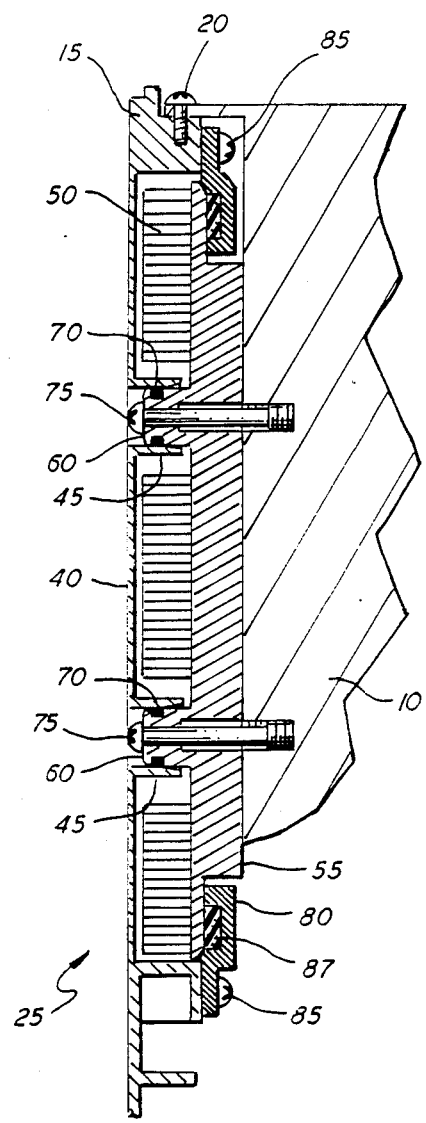
FIG. 3 is a view similar to FIG. 2, but illustrating the thermal plate drawn up into contact with the load for optimal conduction of heat away therefrom, toward the heat exchanger.

Heat is conducted to finned plate 50 from thermal load 10 by a heat conductor (thermal plate) 55 which is formed integrally with the finned plate. Heat conductor 55 is provided with a plurality of bosses 60 extending outwardly through fins 50 and being interengageable with bosses 45 on outer wall 40 by reception therewithin. As best seen in FIGS. 2 and 3, each of bosses 60 is provided with an annular groove therearound which receives an annular O-ring seal 70 therewithin, whereby the heat conductor and fins 50 are maintained in a "floating" engagement with heat exchanger end wall 40. Each of the bosses is also drilled to accommodate a fastener such as screw 75 by which heat conductor 55 is fixed in firm surface-to-surface engagement with thermal load 10. It will be noted that the heads of screws 75 are conveniently accessed from exteriorly of the chassis through the bores in heat exchanger end wall 40.

A retaining plate 80 is screwed to frame 15 on an opposite side of heat conductor 55 as heat exchanger 25, by screws 85. Retaining plate 80 is provided with a gland therearound which accommodates a resilient seal 87 such as a closed cell synthetic foam which seals load 10 from direct contact with the heat exchange fluid and biases heat conductor 50 outwardly for ease in retraction from thermal load 10.

While a single end of the mounting arrangement of the thermal load 10 to chassis 15 has been described, it will be understood that the opposite end (not shown) of that assembly may be essentially similar.

As set forth hereinabove, in meeting manufacturing tolerances and providing clearances for the installation and replacement of electronic module 10, spacing may exist within the chassis between thermal plate 55 and module 10 as shown in FIG. 2. However, as further set forth hereinabove, such a spacing would detract significantly from the ability of thermal plate 55 to conduct heat away from module 10 and into the interior of heat exchanger 25. Accordingly, to eliminate such a spacing during assembly, fasteners 75 are tightened, drawing thermal plate 55 into firm, fixed contact with module 10. The elongate bosses on heat exchanger end wall 40 and thermal plate 55 remain engaged with each other by means of O-ring seals 70 to preserve a seal between the thermal plate and heat exchanger end wall, thereby preventing leakage of heat exchange fluid from the interior of the heat exchanger. As thermal plate 55 is drawn into contact with module 10, gasket 85 is compressed between the thermal plate and the retaining plate to seal the module from contact with the heat exchange fluid. In the event that it is desired to remove or replace the module, screws and 75 are removed whereby thermal plate 55 is urged outwardly by gasket 85 to provide a clearance between the plate and module which allows movement of the module past the thermal plates.

It will thus be appreciated that with the arrangement of the present invention, effective contact between a thermal load and a heat conductor may be maintained despite the provision of clearances due to adherence to manufacturing tolerances and as required for the removal of the load from the chassis therefor. The O-ring seals allow the thermal plate to "float" on the heat exchanger to accommodate three-dimensional movement of the thermal plate due to thermal growth and contraction and alignment of the thermal plate with associated components of the assembly as the plate is drawn into and out of contact with module 10. The gasket effectively seals the module from contact with heat exchange fluid. The fasteners are easily accessible from the exterior of the arrangement through bosses 60 for ease in assembly and disassembly.

While a particular embodiment of the present invention has been described, it will be apparent to those skilled in the art that various modifications thereof may be made without departing from the present invention. Thus, while particular shapes of the various components have been illustrated and described, it will be apparent that various other shapes may be employed as dictated by the type of thermal load and the application of the invention hereof. While the thermal load 10 has been described in terms of an electronic circuit module, it will be apparent that the invention hereof may be used with equal utility with any of various other types of thermal loads. Furthermore, while various materials have been described, it will be appreciated that other materials may be employed as dictated by the type of thermal environment and the nature of the load. Accordingly, it is intended by the following claims to cover these and any other further modifications as may come within the true spirit and scope of the invention.

Having thus described the invention, what is claimed is:

1. In an arrangement for mounting a thermal load to a heat exchanger having an outer wall and adapted for cooling said load, a heat conductor disposed between said heat exchanger and load for conducting heat from said load to said heat exchanger, and fasteners for attaching said heat conductor to said load, the improvement characterized by:
    said heat conductor being spaced from said heat exchanger outer wall and defining therewith, a conduit which accommodates fluid flow therebetween;
    first and second elongate locators on said heat exchanger outer wall and heat conductor respectively, said locators being interengageable with one another over a range of relative spacings between said heat exchanger outer wall and heat conductor; and
    first resilient sealing means disposed between said first and second locators for sealing said locators to one another,
    whereby clearances between said heat conductor and load may be taken up by drawing said heat conductor away from said heat exchanger outer wall, into firm contact with said load, without risk of leakage of said fluid from between said heat conductor and heat exchanger outer wall.

2. The arrangement of claim 1 characterized by said first locator comprising a first, hollow boss extending inwardly from said heat exchanger outer wall, and said second locator comprising a second boss extending outwardly from said heat conductor and slidably received within said first boss.

3. The arrangement of claim 1 characterized by said fasteners comprising elongate fasteners extending from said load, outwardly, through said second boss and being accessible from the exterior of said heat exchanger at the interior of said first boss.

4. The arrangement of claim 2 characterized by said first resilient sealing means comprising at least one O-ring seal disposed between said first and second bosses.

5. The arrangement of claim 1 characterized by said mounting arrangement including:

a frame;

a retaining member fixed to said frame on an opposite side of said heat conductor as said heat exchanger outer wall; and a second resilient sealing means fixed to said retaining member and engaged with said heat conductor, thereby biasing said heat conductor toward said heat exchanger for ease in retraction of said heat conductor from said load and for sealing said heat exchanger fluid from contact with said heat exchanger fluid.

6. The arrangement of claim 5 characterized by:
said retaining member comprising a plate having a gland therein, and
said second resilient sealing means comprising a gasket formed from a closed cell foam and disposed within said gland.

7. The arrangement of claim 1 characterized by said heat exchanger including a plurality of spaced cooling fins, said cooling fins being provided on an outer surface of said heat conductor and extendable into said fluid conduit.

* * * * *